United States Patent [19]
Kunkel

[11] Patent Number: 5,175,871
[45] Date of Patent: Dec. 29, 1992

[54] POWER AMPLIFIER FOR A CELLULAR TELEPHONE

[75] Inventor: L. P. Kunkel, Lund, Sweden

[73] Assignee: Ericsson/GE Mobile Communication Holding Inc., Paramus, N.J.

[21] Appl. No.: 742,386

[22] Filed: Aug. 8, 1991

[51] Int. Cl.[5] .......................... H04B 1/00; H04B 7/00
[52] U.S. Cl. ........................................ 455/69; 455/93; 455/127; 330/51; 379/58; 379/63
[58] Field of Search ............... 379/58, 59, 63; 330/51; 307/256, 257, 259, 321, 317.1; 375/5; 455/54, 56, 69, 93, 127, 102

[56] References Cited

U.S. PATENT DOCUMENTS

| | | | |
|---|---|---|---|
| 4,180,748 | 12/1979 | Gargini | 307/259 |
| 4,442,407 | 4/1984 | Apel | 330/128 |
| 4,449,103 | 5/1984 | Kyrian | 330/123 |
| 4,495,648 | 1/1985 | Giger | 455/73 |
| 4,502,152 | 2/1985 | Sinclair | 455/73 |
| 4,731,798 | 3/1988 | Dirr | 375/38 |
| 4,777,653 | 10/1988 | Bonnerot et al. | 455/69 |
| 4,829,554 | 5/1989 | Barnes et al. | 379/58 |
| 4,912,774 | 3/1990 | Saito | 455/117 |
| 5,020,076 | 5/1991 | Cahill et al. | 375/5 |
| 5,056,109 | 10/1991 | Gilhousen et al. | 455/69 |
| 5,060,294 | 10/1991 | Schwent et al. | 455/93 |

FOREIGN PATENT DOCUMENTS

| | | | |
|---|---|---|---|
| 0138673 | 12/1978 | Japan | 307/256 |
| 0314025 | 12/1989 | Japan | 455/127 |

Primary Examiner—Reinhard J. Eisenzopf
Assistant Examiner—Timothy H. Keough

[57] ABSTRACT

In a cellular telephone of the type capable of operating in both analog and digital modes, a power amplifier is provided which can operate efficiently in both the analog and digital modes of operation. The power amplifier includes a non-linear power amplifier stage and a linear power amplifier stage which are controlled by a switching means. During the analog mode of operation, the switching means causes the non-linear amplifier stage to amplify the RF signals. During the digital mode of operation, the non-linear amplifier amplifies the RF signal when there is a requirement for a relatively low power output. During the digital mode when there is a requirement for a relatively high level output, the switching means causes the non-linear power stage and the linear power stage to amplify the RF signals.

5 Claims, 2 Drawing Sheets

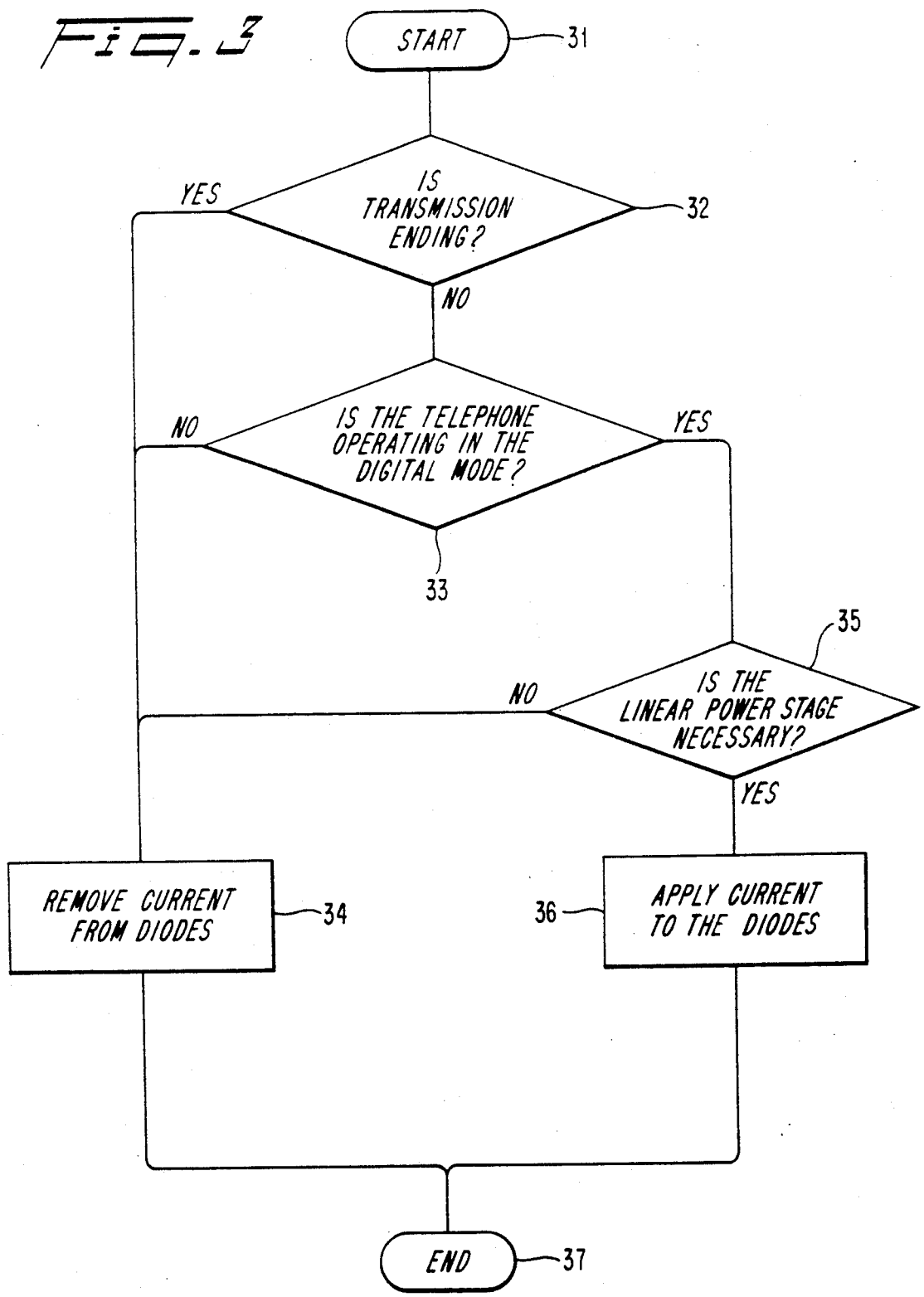

… … …

POWER AMPLIFIER FOR A CELLULAR TELEPHONE

FIELD OF THE INVENTION

The present invention relates generally to mobile radio communication systems which include cellular telephones. More particularly, the invention relates to a power amplifier for use with a cellular telephone that is capable of operating in both analog and digital modes.

BACKGROUND OF THE INVENTION

A cellular telephone system is a radio communication system in which a plurality of mobile stations operate within a cell which is serviced by a base station. There are typically a relatively large number of cells and base stations in a given service area. The base station in each cell is connected to a message switching center which in turn is connected to a public telephone system.

The first cellular mobile systems placed in public use were analog systems typically used for speech or other types of analog information. These systems include multiple radio channels for transmitting analog information between base and mobile stations by transmitting analog modulated radio signals. The analog systems are being replaced by dual mode systems which are capable of operating in either a digital or analog mode of operation. The Electronic Industry Association (EIA) has published EIA/TIA Project No. 2398, entitled "Cellular System, Dual-Mode Mobile Station-Base Station Compatibility Standard", IS-54 (Revision A), dated January 1991; and TR45.3, Project No. 2216, entitled "Cellular System, Recommended Minimum Performance Standards for 800 MHz Dual Mode Mobile Stations," dated March 1991. These Interim Standards provide specifications for the design of a cellular telephone system which is capable of operating in both analog and digital modes.

The emerging mobile telephone system, which is commonly referred to as the ADC-System, will work in both analog and digital modes. A telephone operating in the analog mode will have a power stage that will work continuously at a power level determined by the base station, and the modulation method will be FM. The maximum allowed output power of a mobile station will depend on the class of the mobile station. Presently, there are four classes I, II, III and IV, and the maximum output power of the classes are +6, +2, −2, and −2 dBW ERP, respectively. Accordingly, such a system advantageously employs a non-linear transmitter power stage having a high power efficiency. The EIA has specified that the digital mode will have a modulation method which will include a substantial amplitude variation in the transmitted signal ($\pi/4$-DQPSK). The amplitude variation has an order of magnitude of approximately 20 dB, and the quotient between the peak and average power is about 4 dB. Accordingly, the power stage for the digital mode will have to be linear, and it will have to be dimensioned for a higher peak power. The problem with a completely linear power stage is that the power efficiency is relatively low. The specified digital mode, however, only requires that the transmission take place in one of three time slots in a full rate mode or in one of six time slots in a half rate mode. Because the transmission occurs in different time slots, the current consumption is not of utmost importance.

It is desirable that the transmitter power amplifier of a telephone in the ADC-system be able to operate (1) continuously in the analog mode with high power efficiency, and (2) in the digital mode where there are restrictive requirements on power level and linearity. Accordingly, there is a need for a transmitter power amplifier that can efficiently meet the requirements of analog and digital operation in an ADC-system.

SUMMARY OF THE INVENTION

The present invention relates to a transmitter power amplifier for a cellular telephone that is capable of operating in both analog and digital modes. The power amplifier includes a linear power stage and a non-linear power stage. The linear and non-linear power stages are controlled by a switching means such that the non-linear stage or the non-linear stage serially connected to the linear stage are utilized during a particular mode of operation. In the analog mode of operation, only the non-linear power stage is used to amplify RF signals. In the digital mode of operation only the non-linear stage in its linear range of operation is used to amplify RF signals, when the base station dictates a relatively low power output. When the base station dictates a relatively high level power output in the digital mode, both the linear and non-linear power stages are used to amplify the RF signals, where the non-linear stage acts as a linear driver stage. The switching means which controls the selection of the linear and non-linear power stages may itself be controlled by a suitably programmed microprocessor.

BRIEF DESCRIPTION OF THE DRAWINGS

FIG. 3 is a flow chart of a software program that can be utilized to control the switching means.

DETAILED DESCRIPTION OF THE INVENTION

Figure 1:
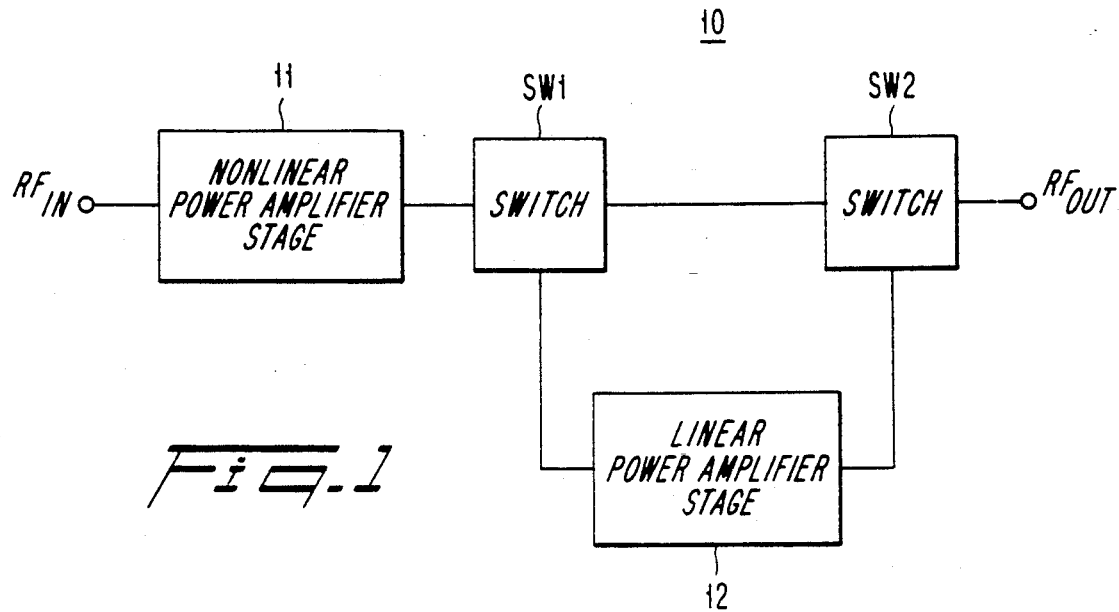
FIG. 1 is a block diagram which illustrates the power amplifier of the present invention.

Referring to FIG. 1, a block diagram illustrates the power amplifier 10 of the present invention. The power amplifier 10 is used in the transmitter portion of a cellular telephone that is capable of operating in both digital and analog modes. The power amplifier 10 receives an RF input signal at a terminal designated $RF_{in}$. The $RF_{in}$ signal is applied to a non-linear power amplifier stage 11. The output of the non-linear power stage 11 is applied to a switching means comprised of switches SW1 and SW2. The output of switch SW2 is an RF output signal which appears at a terminal designated $RF_{out}$. In the analog mode of operation only the non-linear power amplifier stage 11 is used to amplify the RF input signal. In the digital mode of operation at relatively high power levels, the switching means causes the output of the non-linear power amplifier stage 11 to be applied to the serially connected linear power amplifier stage 12. The output of the linear power amplifier stage 12 is then applied back through the switching means and appears as the RF output signal at the terminal $RF_{out}$.

The present invention is based on the concept that the non-linear power stage 11, when operated at a relatively low power level, in relation to its maximum power level, is sufficiently linear to meet the requirements of the EIA Interim Standards for both analog and digital modes of operations. In other words, the non-linear power stage 11 is sufficiently linear to provide modulation accuracy and adjacent channel emission even when it is used at relatively low power levels in the digital mode. In the analog mode of operation, the non-linear power amplifier stage 11 alone is acceptable for supplying all output power at all power levels. When operating in the digital mode of operation and at a relatively high level power, the additional linear power amplifier stage 12 is connected to the output of the non-linear power stage in order to provide a RF$_{out}$ signal that meets the linearity and power level requirements of the digital mode.

Figure 2:
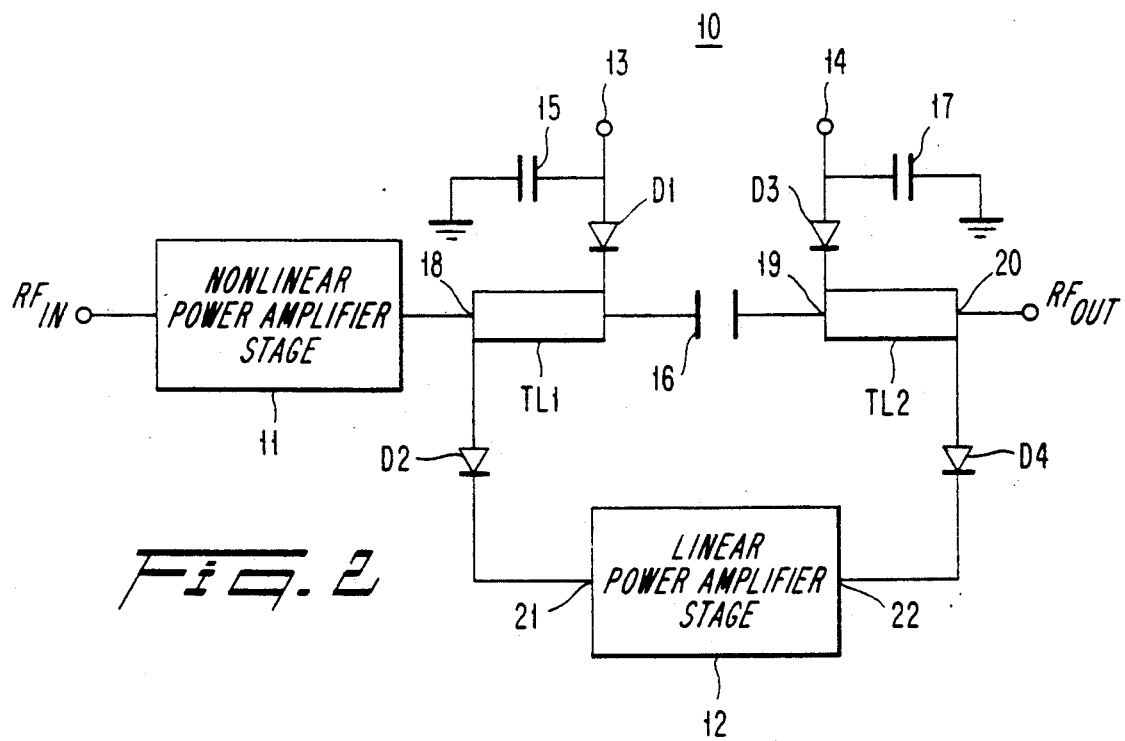
FIG. 2 is a schematic diagram of the switching means used to control the non-linear power stage and the linear power stage.

Referring now to FIG. 2, a schematic diagram illustrates the switching means which controls the non-linear power amplifier stage 11 and the linear power amplifier stage 12. Preferably, the additional linear power amplifier stage 12 is comprised of one or more transistor devices, either bi-polar or FET (field effect transistor), having both collector/drain current and base/gate voltages. Preferably, the switching means is comprised of diodes D1-D4; transmission lines TL1, TL2; and capacitors 15, 16, 17.

In operation, a terminal 14 is connected to the internal DC-feed, e.g., the battery voltage, of the power amplifier 10, and it is connected to a collector or a drain of the linear power amplifier stage 12. There is no current flowing through terminal 14 until the transistor devices of the linear power amplifier stage 12 are biased. The diodes D3, D4 are, therefore, switched off. A terminal 13 is either connected to ground when the linear power amplifier stage 12 is switched off, or the terminal 13 is connected to a suitable voltage source when the additional linear power stage 12 is activated. If GaAs transistors are being used in the linear amplifier stage 12, voltages below ground may be needed to turn the device off. If the terminal 13 is connected to ground, no current flows through the diodes D1, D2, and the diodes appear as an RF open circuit. Accordingly, an RF signal applied to the non-linear power amplifier stage 11 is transmitted through the transmission line TL1, the capacitor 16, and the transmission line TL2 to the output terminal RF$_{out}$, when the terminal 13 is connected to ground.

If the terminal 13 is connected to a suitable voltage, a current flows through the diodes D1, D2 and through the biasing circuit of the linear power amplifier stage 12. The current flowing through the diodes D1, D2 makes them appear as an RF short circuit. Since the linear power amplifier stage 12 is being biased, the collector/drain currents also start to flow through the diodes D3, D4, and the diodes appear as RF short circuits. Accordingly, the RF$_{in}$ signal is transmitted through the non-linear amplifier stage 11 and the linear power amplifier stage 12 to the output terminal RF$_{out}$.

The transmission lines TL1, TL2 are preferably two quarter wavelength transmission lines. The switching means also preferably includes decoupling capacitors 15, 17 and a capacitor 16 disposed between the transmission lines TL1, TL2. The capacitor 16 presents a very low impedance at RF frequencies, and acts as a DC-block. When the diodes D1, D2, D3, D4 have current flowing in them and appear as an RF short circuit, the transmission line TL1 is shorted to RF ground via the capacitor 15. Since the transmission line TL1 is a quarter wavelength long, the input terminal 18 of transmission line TL1 appears as an open circuit at RF frequencies. Likewise, the input terminal 19 of transmission line TL2 becomes RF shorted, and the output terminal 20 of transmission line TL2 appears as an RF open circuit. This arrangement permits the transmission of RF power from the non-linear power amplifier stage 11 to the input terminal 21 of the additional power amplifier stage 12, and the amplified RF power is then transmitted from the output terminal 22 to the RF output terminal.

The transmission lines TL1, TL2 have a length which is related to the wavelength of the transmitted signal at the center frequency of the band to which the transmitter is tuned. Accordingly, the physical length of the transmission lines vary due to the material properties from which the transmission lines are made.

Referring now to FIG. 3, there is a flow chart of a software subroutine which can be used to control the switching means. Preferably, the switching means is controlled by a suitably programmed microprocessor running the subroutine which has a starting step 31. In step 32 a determination is made whether there is a command to end transmission. If there has been a command to end transmission then step 34 is performed removing current from the diodes. If there has been no command, then it means that the subroutine has been called, because the telephone is being commanded to transmit or a power level change is being commanded. The subroutine then advances to step 33 where a determination is made whether the telephone is operating in the digital mode. If the telephone is not operating in the digital mode, then it is operating in the analog mode, and step 34 causes current to be removed from the diodes. The current is removed from the diodes when no voltage appears at terminal 13. Accordingly, RF signals are input to the non-linear power stage 11 and transmitted to the RF$_{out}$ terminal through transmission lines TL1, TL2 and capacitor 16.

If the telephone is operating in the digital mode, a determination is made in step 35 whether the linear power amplifier stage 12 is necessary. The linear power amplifier stage 12 is necessary, if there is a requirement for a relatively high power level. If the linear power amplifier stage 12 is not necessary, then the software insures that the current is not present at terminal 13 by performing the step 34. If the linear power stage is necessary, step 36 is performed which includes applying current to the diodes D1-D4. If the diodes D1-D4 become conductive, then the linear power amplifier stage 12 is coupled to the output of the non-linear power amplifier stage 11. The subroutine then advances to an end step 37.

While the invention has been described in its preferred embodiments, it is to be understood that the words that have been used are words of description rather than limitation and that changes within the purview of the appended claims may be made without departing from the true scope and spirit of the invention in its broader aspects.

I claim:

1. A power amplifier for a radio telephone transmitter operable in an analog mode, a relatively low power digital mode, and a relatively high power digital mode, comprising:

a non-linear stage for amplifying a radio frequency signal;

a linear stage for amplifying the radio frequency signal, said linear stage being serially connectable to the output of said non-linear stage; and switching means for allowing the radio frequency signal to be applied only to the non-linear stage when the transmitter is operating in either the analog mode or the relatively low power digital mode in accordance with predetermined signals, and said switching means allowing the radio frequency signal to be applied to said non-linear stage and said linear stage when the transmitter is operating in the relatively high power digital mode in accordance with the predetermined signals.

2. A power amplifier according to claim 1 wherein said switching means includes first and second capacitively coupled transmission lines coupled to the output of said non-linear stage.

3. A power amplifier according to claim 2 wherein the switching means further includes first and second diodes coupled to the ends of the first transmission line and third and fourth diodes coupled to the ends of the second transmission line, such that said linear stage is electrically coupled to the output of said non-linear stage when predetermined voltage levels are applied to said first and third diodes and said linear stage is electrically isolated from the output of said non-linear stage when the predetermined voltage levels are not present at said first and third diodes.

4. A power amplifier according to claim 3 wherein the first and third diodes are coupled to ground via capacitors.

5. A method of amplifying a radio frequency signal in a radio telephone having an analog mode, a relatively low power digital mode, and a relatively high power digital mode of operation, comprising the steps of:
   amplifying the radio frequency signal in the analog mode of operation and in the relatively low power digital mode of operation with only a non-linear amplifier stage;
   amplifying the radio frequency signal with the non-linear amplifier stage and a linear amplifying stage serially connectable to the output of said non-linear amplifier stage during the relatively high power digital mode of operation; and
   controlling the output of the non-linear amplifier stage and the linear amplifier stage such that in the analog mode and in the relatively low power digital mode the radio frequency signal is output from the non-linear amplifier stage in accordance with predetermined signals, and in the relatively high power digital mode the output of the non-linear amplifier stage is serially connected to the linear amplifier stage and the radio frequency signal is output from the linear amplifier stage in accordance with predetermined signals.

* * * * *